(12) United States Patent
Levi et al.

(10) Patent No.: US 11,302,586 B2
(45) Date of Patent: Apr. 12, 2022

(54) COMPACT AND EFFICIENT CMOS INVERTER

(71) Applicant: Integrated Silicon Solution, (Cayman) Inc., Grand Cayman (KY)

(72) Inventors: Amitay Levi, Cupertino, CA (US); Dafna Beery, Palo Alto, CA (US); Andrew J. Walker, Mountain View, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 16/836,590

(22) Filed: Mar. 31, 2020

(65) Prior Publication Data

US 2021/0305105 A1 Sep. 30, 2021

(51) Int. Cl.
| | | |
|---|---|---|
| H01L 21/8238 | (2006.01) | |
| H01L 27/092 | (2006.01) | |
| H01L 23/535 | (2006.01) | |
| H01L 29/78 | (2006.01) | |
| H01L 21/02 | (2006.01) | |
| H01L 21/3065 | (2006.01) | |

(Continued)

(52) U.S. Cl.
CPC ........... *H01L 21/823885* (2013.01); *H01L 21/02636* (2013.01); *H01L 21/308* (2013.01); *H01L 21/3065* (2013.01); *H01L 21/823871* (2013.01); *H01L 23/535* (2013.01); *H01L 27/092* (2013.01); *H01L 29/66666* (2013.01); *H01L 29/7827* (2013.01)

(58) Field of Classification Search
CPC .............. H01L 27/092; H01L 27/0922; H01L 27/0927; H01L 27/0925; H01L 27/0928; H01L 21/7827; H01L 21/66666; H01L 21/78642; H01L 21/823885; H01L 21/823871; H01L 29/78615; H01L 29/1087; H01L 21/308; H01L 29/7827; H01L 29/66666; H01L 21/3065; H01L 21/02636; H01L 23/535

See application file for complete search history.

(56) References Cited

U.S. PATENT DOCUMENTS 5,576,570 A * 11/1996 Ohsawa ............ H01L 27/0218
257/369
10,439,064 B1 * 10/2019 Mann .................. H01L 27/1104
(Continued)

*Primary Examiner* — Robert G Bachner

(57) ABSTRACT

A structure for providing an inverter circuit employing two vertical transistor structures formed on a semiconductor substrate. The vertical semiconductor structures each include a semiconductor pillar structure and a surrounding gate dielectric. A gate structure is formed to at least partially surround the first and second vertical transistor structures. The semiconductor substrate is formed into first and section regions that are separated by a dielectric isolation structure. The first region includes a P+ doped portion and an N+ doped portion, and the second region includes an N+ doped portion and a P+ doped portion. The N+ and P+ doped portions of the first and second regions can be arranged such that the N+ doped portion of the first region is adjacent to the P+ doped portion of the second region, and the P+ doped portion of the first region is adjacent to the N+ doped portion of the second region.

6 Claims, 18 Drawing Sheets

(51) Int. Cl.
*H01L 21/308* (2006.01)
*H01L 29/66* (2006.01)

(56) References Cited

U.S. PATENT DOCUMENTS

2015/0179655 A1* 6/2015 Nakanishi ............. H01L 27/281
 257/9
2017/0365597 A1* 12/2017 Colinge ............. H01L 27/0266

* cited by examiner

COMPACT AND EFFICIENT CMOS INVERTER

FIELD OF THE INVENTION

The present invention relates to semiconductor circuitry and more particularly to a CMOS inverter structure employing a vertical semiconductor structure.

BACKGROUND

Advances in integrated circuit (IC) technology have led to an exponential growth in the availability of commercially available electronic devices such as cellular phones, laptop computers, etc. However, there remains a need for ever increased scaling of such devices such as with regard to size and power consumption. Common two-dimensional integrated circuit design possesses limits as to the density of such devices and limits with regard to reduced power consumption and current leakage. One type of circuitry that can be constructed using integrated circuit fabrication techniques is an inverter circuit.

The need for ever increasing circuit and data density has driven a push to further reduce the size of integrated circuits such as an inverter circuit described above. In addition, it is often desirable to adjust current drive based on various design requirements. However, limitations of current semiconductor manufacturing technologies have limited the ability to further reduce circuit size. In addition, current circuit structure designs have not allowed for an easy adjustment of drive current as would be desirable in many applications. Therefore, there remains a need for a novel circuit design and method of manufacture that can overcome these limitations to provide a highly scaled circuit such as an inverter circuit and that can allow for fine tuning of current drive to accommodate a wide range of applications.

SUMMARY

The present invention provides an inverter structure employing vertical transistor structures. The inverter structure includes a substrate having first and second regions separated by a dielectric isolation structure. The first region includes an N+ doped portion and a P+ doped portion, and the second region includes a P+ doped portion and an N+ doped portion. A first vertical transistor structure is formed on the P+ doped portion of the first region of the semiconductor substrate, and a second vertical transistor structure is formed on the N+ doped portion of the second region of the semiconductor substrate.

The first and second vertical transistor structures can each include a semiconductor pillar structure and a gate dielectric layer surrounding the semiconductor pillar structure, and can further include a gate structure that at least partially surrounds each of the vertical transistor structures. The gate structure can include an electrically conductive gate layer located between first and second dielectric layers. The semiconductor pillar structure can be an epitaxially grown semiconductor material, which can have a substantially monocrystalline structure, such as at least 80 percent or more preferably at least 90 percent monocrystalline by volume.

The semiconductor pillar structure can have the shape of a rectangular prism, having a rectangular cross-section along a plane parallel with the substrate. The N+ and P+ doped portions can be arranged such that the N+ doped portion of the first region of the semiconductor substrate is adjacent to the P+ doped portion of the second region of the semiconductor substrate, and the P+ doped portion of the first region is adjacent to the N+ doped portion of the second region.

The inverter structure can further include a first electrically conductive lead that is connected with the semiconductor pillar structure of each of the first and second transistor structures, a second electrically conductive lead that is electrically connected with the N+ doped portion and P+ doped portion of the first region of the semiconductor substrate, and a third electrically conductive lead that is electrically connected with the N+ doped portion and P+ doped portion of the second region of the semiconductor substrate.

The inverter structure results in a compact and versatile CMOS inverter for advanced technology nodes formed by selective epitaxially grown vertical channel transistors. The channel length is defined by layer deposition rather than photolithography. This advantageously allows much easier scaling and better dimension control as compared with prior art technologies such as FinFET transistor technologies.

Channel width and transistor drive is defined by lithography. This allows for easy adjustment of current drive as compared with FinFET technologies wherein current drive can only be adjusted in incremental values. In addition, layout requirements are advantageously much simpler than with prior art FinFET technologies.

The inverter structure can be constructed using pure CMOS design. The inverter structure can be used for any memory device which uses a vertical transistor as a select transistor. As an advantage, the overall process to form the memory chip will be significantly simplified.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
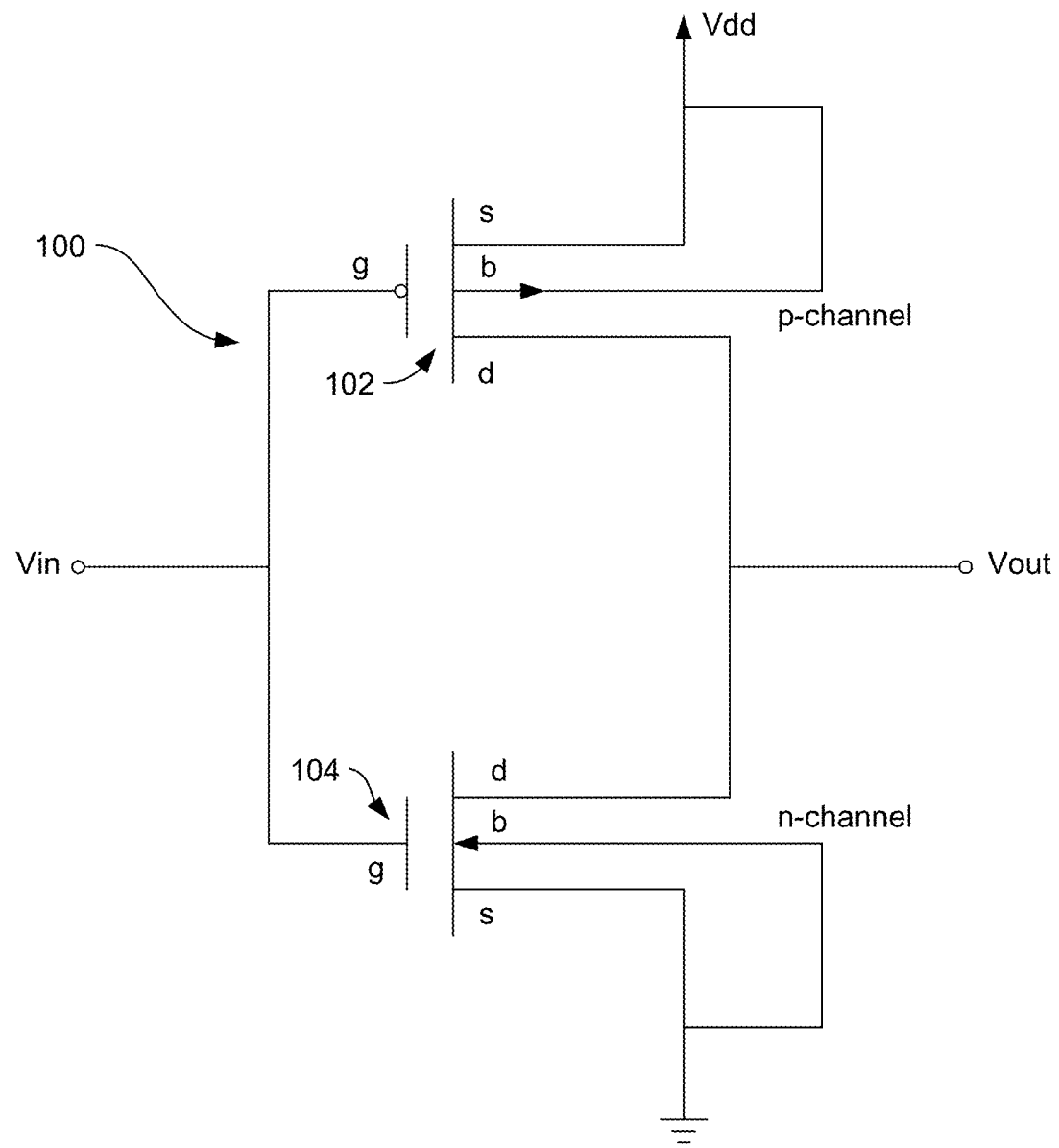
FIG. 1 is an electrical schematic of an example of an inverter circuit according to the prior art.

FIG. 1 shows an electrical schematic of a conventional inverter circuit 100 which includes a PMOS transistor 102 and an NMOS transistor 104. Each transistor 102, 104 is a four-terminal device, having a drain d, a source s, a gate g, and a bulk b. The gates of the PMOS transistor 102 and NMOS transistor 104 are connected together to form an input terminal Vin. The drains of the PMOS transistor 102 and NMOS transistor 104 are connected together to form an output Vout. The sources of the PMOS transistor 102 and NMOS transistor 104 are connected to ground.

Figure 2:
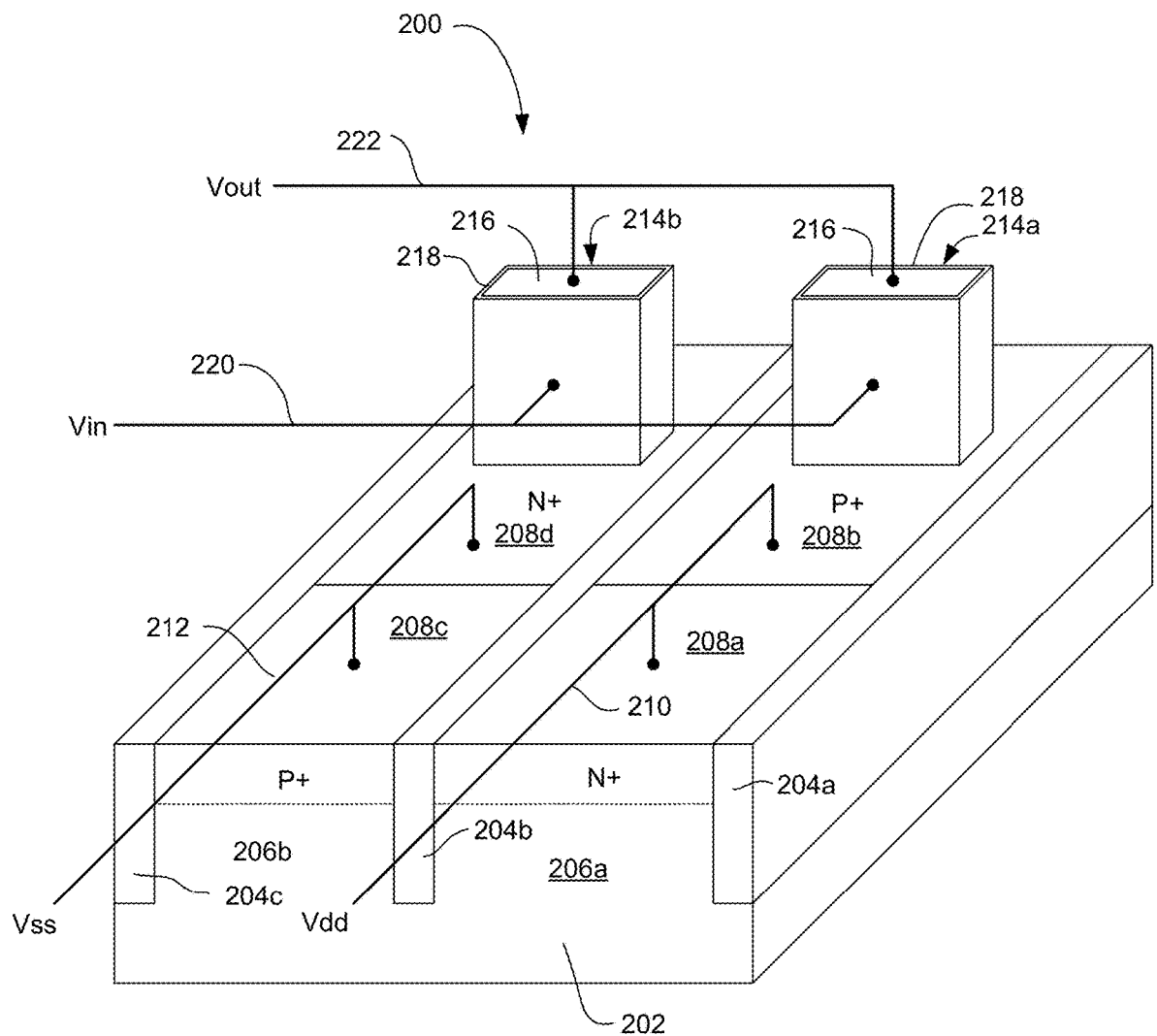
FIG. 2 is a perspective schematic view of an inverter circuit structure according to an embodiment.

FIG. 2 is a perspective schematic view illustrating an inverter circuit structure according to an embodiment. The inverter structure 200 includes a semiconductor substrate 202, which can be a silicon substrate or could be another type of semiconductor material such as SiGe. One or more trench isolation layers 204a-c can be formed in the substrate to provide electrical isolation between regions of the substrate 202. The trench isolation layers 204 can be a dielectric material such as an oxide or nitride. The area between the first and second trench isolation layers 204a, 204b forms a first semiconductor region 206a, and the region between the second and third trench isolation layers 204b, 204c forms a second semiconductor region 206b. The surface of the semiconductor regions 206a, 206b are doped. As shown in FIG. 2, in the first semiconductor region 206a has a first doped portion 208a that is N+ doped, and a second portion 208b that is P+ doped. Similarly, the second semiconductor region 206b has a first doped portion 208c that is P+ and a second portion 208d that is N+ doped. The doped portions 208a-d are arranged such that each portion is adjacent to an area of opposite doping. For example, the N+ doped portion 208a is adjacent to the P+ doped portion 208b, and is also adjacent (across the trench isolation layer 204b) to the P+ doped portion 208c. Similarly, the N+ doped portion 208d is adjacent to P+ doped portion 208c within the same semiconductor region 206b and is also adjacent to the P+ doped area 208b across the trench isolation layer 204b. A drain voltage Vdd is supplied to doped portions 208a, 208b via Vdd line 210. Similarly, a source voltage Vss is supplied to doped portions 208c, 208d via Vss line 212.

Two vertical semiconductor transistor structures 214a, 214b are formed on the doped surface of the substrate. As shown in FIG. 2, the first vertical transistor structure 214a is formed on the P+ doped area 208b and the second vertical transistor structure 214b is formed on the N+ doped area 208d. Each of the transistor structures includes a semiconductor pillar 216, which is surrounded at its sides by a gate dielectric layer 218. The semiconductor pillar is preferably a monocrystalline or nearly monocrystalline semiconductor pillar structure. Each semiconductor pillar structure 216 is preferably an epitaxial semiconductor structure that is preferably grown by selective epitaxial growth on the surface of the substrate 202, as will be described in greater detail herein below. The semiconductor pillar structures 216 can be epitaxially grown Si, SiGe, etc. this epitaxial semiconductor growth allows the semiconductor pillar structures 216 to have a monocrystalline or nearly monocrystalline structure. For example, the semiconductor pillars 216 can have a structure that is at least 80 percent monocrystalline by area or more preferably at least 90 percent monocrystalline by volume. This monocrystalline or nearly monocrystalline structure of the semiconductor pillars advantageously maximizes electrical conduction through the transistor structure 214a, 214b when in an "on" state, maximizes switching speed and minimizes leakage. The gate dielectric layers 218 can be constructed of an oxide or nitride, such as silicon oxide or silicon nitride, and can be formed by processes described herein below.

An input voltage Vin can be supplied to the gate dielectric 218 of each of the transistor structures 214 via line 220. The Vin voltage provides a gate voltage to the transistor structures 214. A more specific structure for providing this gate voltage according to one possible embodiment will be described herein below. An output voltage Vout can be supplied to an end of the semiconductor pillar structure 216 of each of the transistor structures 214a, 214b via line 222. The output voltage is connected with an end of the pillar structure 216 that is opposite the substrate 202. This end of the semiconductor pillar structure 216 can act as a drain of the each of the transistor structures 214.

With continued reference to FIG. 2 it can be seen that the transistor structures 214 have a shape of a rectangular prism, with a rectangular cross-section in a plane parallel with the surface of the substrate 202. This rectangular prism shape of the transistor structures advantageously allows for easy adjustment of the performance properties, such as drive current, of the transistor structures 214, and of the inverter circuitry 200 has a whole. By simply altering one dimension (e.g. the width of the pillar structure 216, the cross-sectional area of the semiconductor transistor structure 214a, 214b and ratio of gate dielectric perimeter to semiconductor area can be easily varied to adjust for a desired drive current.

Figure 3:
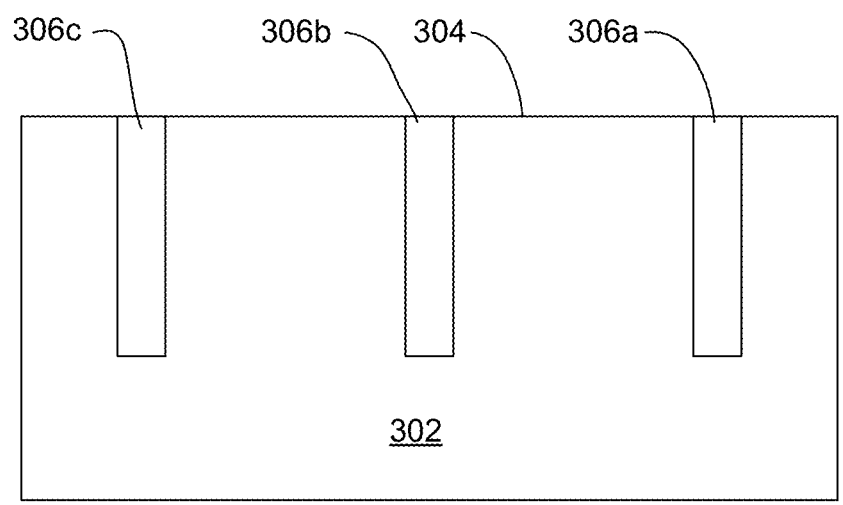
FIGS. 3-18 are views of an inverter circuitry in various intermediate stages of manufacture in order to illustrate a method for manufacturing an inverter circuit according to an embodiment.

FIGS. 3-18 show inverter circuitry in various intermediate stages of manufacture in order to illustrate a method of manufacturing an inverter circuit according to an embodiment, and to illustrate a more particular structure for an inverter circuit according to one or more possible embodiments. With reference to FIG. 3, a semiconductor substrate 302 is provided. Only a small portion of the semiconductor substrate 302 is shown in FIG. 3. The semiconductor substrate 302 can be a mono crystalline Si substrate or could be another type of semiconductor such as, but not limited to SiGe, and has a surface 304. A plurality of dielectric trench isolation layers 306a-c are formed into the surface 304 of the semiconductor substrate 302. The trench isolation layers 306 can be constructed of a material such as an oxide or nitride, such as silicon oxide or silicon nitride, and provide electrical isolation between regions of the substrate. The trench isolation layers 306 can be formed by a process that includes: forming a mask, etching into the substrate 302, depositing a dielectric material, and performing a chemical mechanical polishing (CMP).

Figure 4:
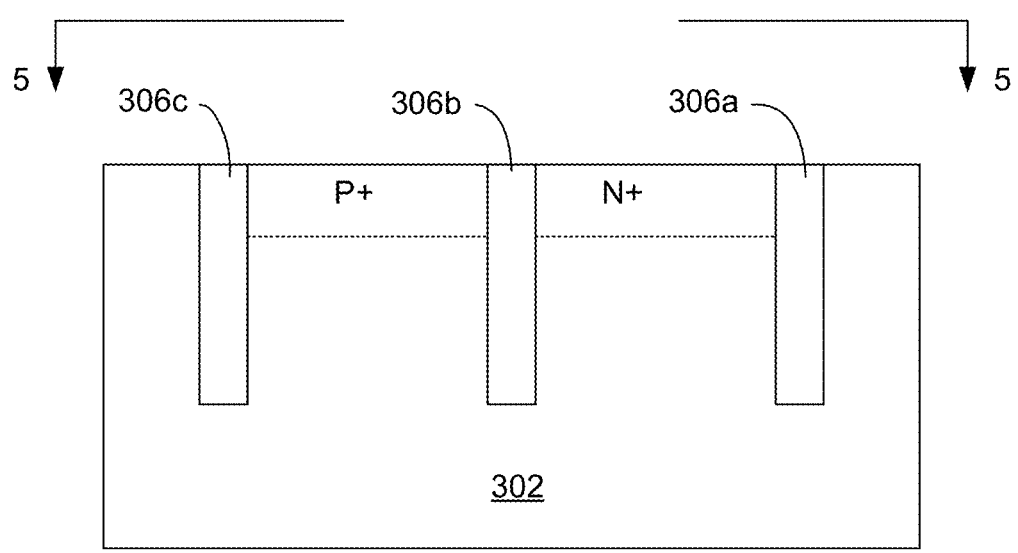
Figure 5:
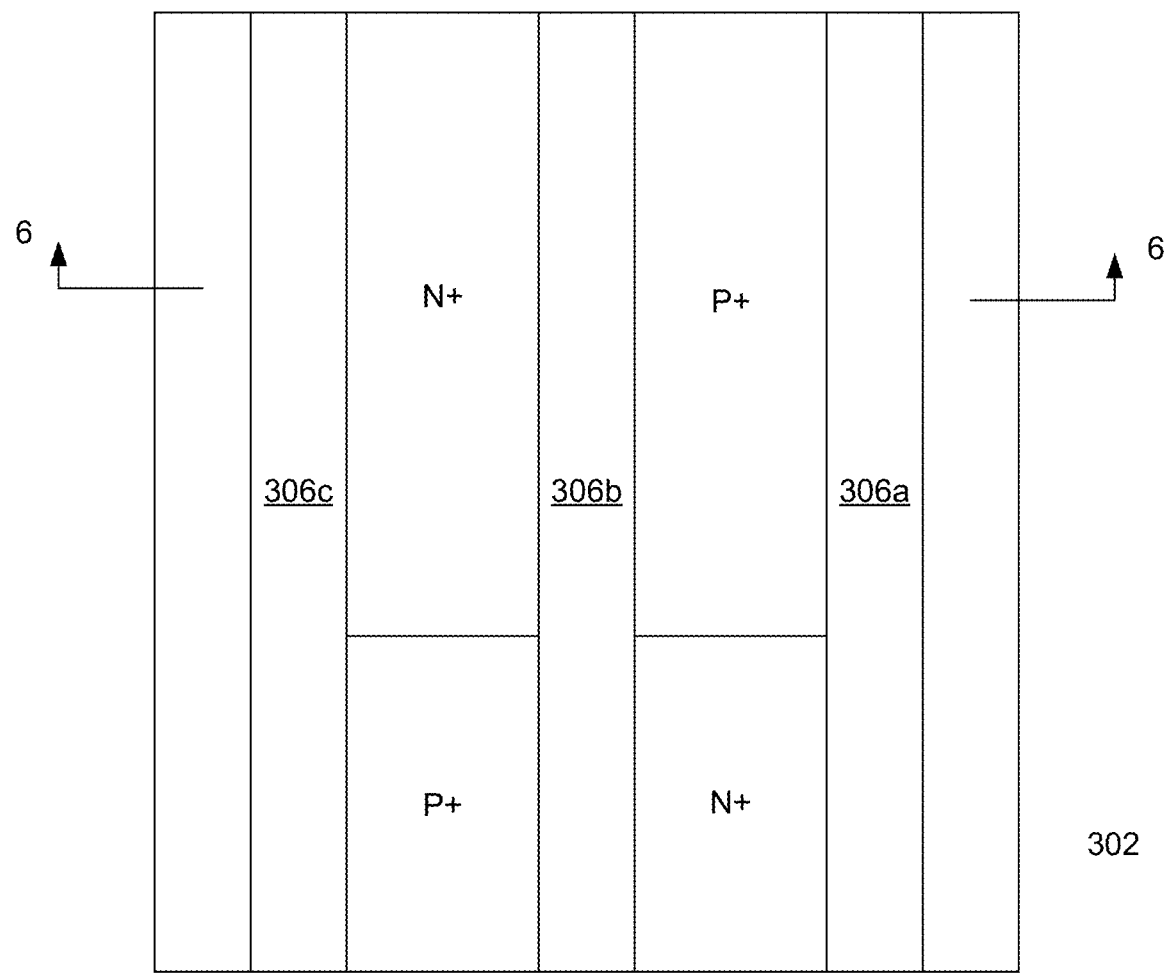

With reference to FIGS. 4 and 5, doped regions are formed in the surface of the substrate 302 in regions between the trench isolation layers 306. The doped regions can be formed by a process such as ion bombardment, and include N+ and P+ doped regions. The arrangement of the N+ and P+ doped regions can be understood more clearly with reference to FIG. 5, which shows a top-down view as seen from line 5-5 of FIG. 4. As shown in FIG. 5, the N+ and P+ doped regions are arranged such that each doping type region is located adjacent to an opposite doping type region. The N+ and P+ doped regions can be formed, for example: forming a first mask and ion implanting a first type of doping material (e.g. N+), and then forming a second mask and ion implanting a second doping material (e.g. P+).

Figure 6:
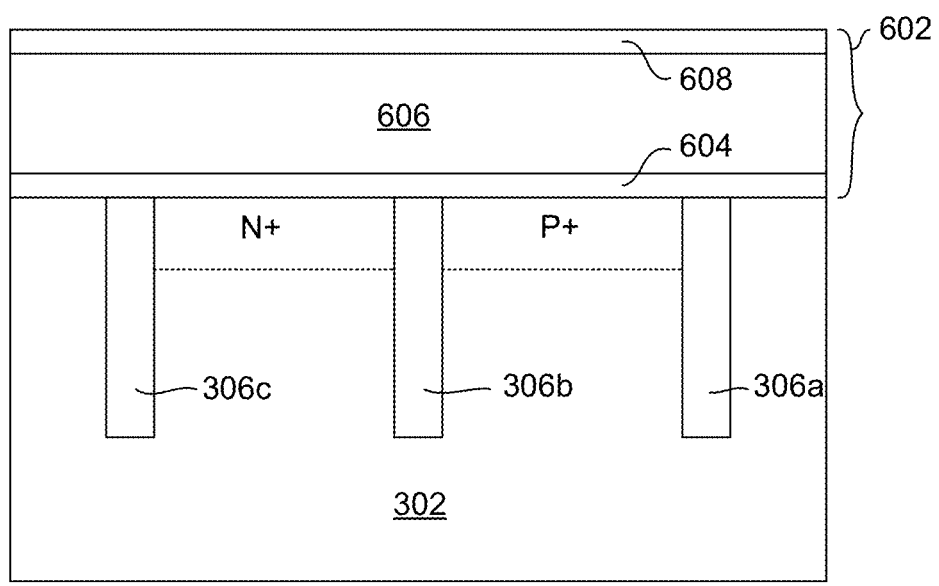

With reference now to FIG. 6, which shows a cross-sectional view as seen from line 6-6 of FIG. 5, a series of gate structure layers 602 are deposited. The gate structures 602 can include a first dielectric layer 604, and electrically conductive gate layer 606 and a second dielectric layer 608, with the layers arranged such that the electrically conductive gate layer 606 is located between the first and second dielectric layers 604, 608. The dielectric layers 604, 608 can be formed of an oxide or nitride such as silicon oxide or silicon nitride. The electrically conductive gate layer 606 can be constructed of highly doped polysilicon, another highly doped semiconductor or some other suitable electrically conductive material.

Figure 7:
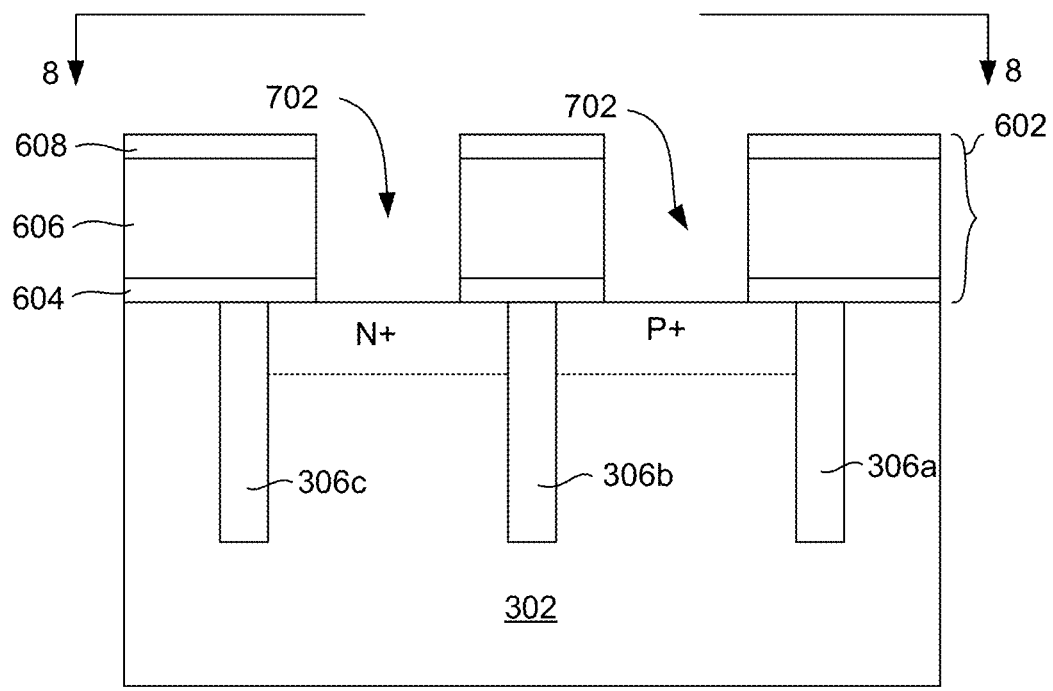
Figure 8:
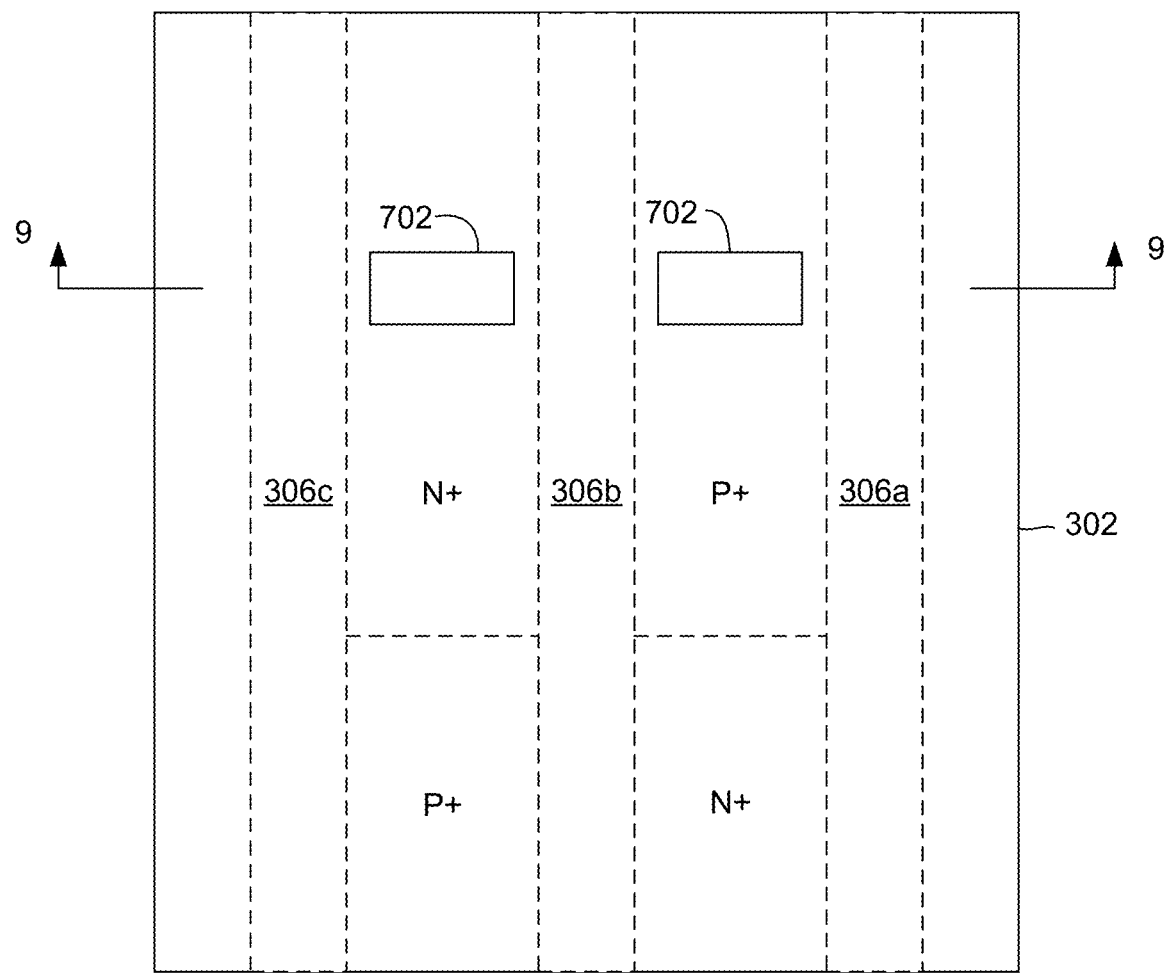

With reference now to FIGS. 7 and 8, openings 702 are formed in the gate line structure 602. The openings extend to the P+ doped and N+ doped regions of the substrate 302. The location of the openings 702 can be seen more clearly with reference to FIG. 8, which shows a top down view as seen from line 8-8 of FIG. 7. As shown in FIG. 8, the openings 702 are preferably formed as rectangular openings, which allow for easy adjustment of transistor properties as will be seen. The openings 702 are formed at locations of opposite P+ and N+ doped regions across the center trench isolation layer 306*b*. The openings 702 can be formed by a masking and etching process, such as by forming a mask structure (not shown) having openings configured to define the openings 702. Then, an etching process such as reactive ion etching or ion milling can be performed to remove portions of the gate structure layers 602 that are not protected by the mask. The mask can then be removed, leaving a structure such as show in FIGS. 7 and 8.

Figure 9:
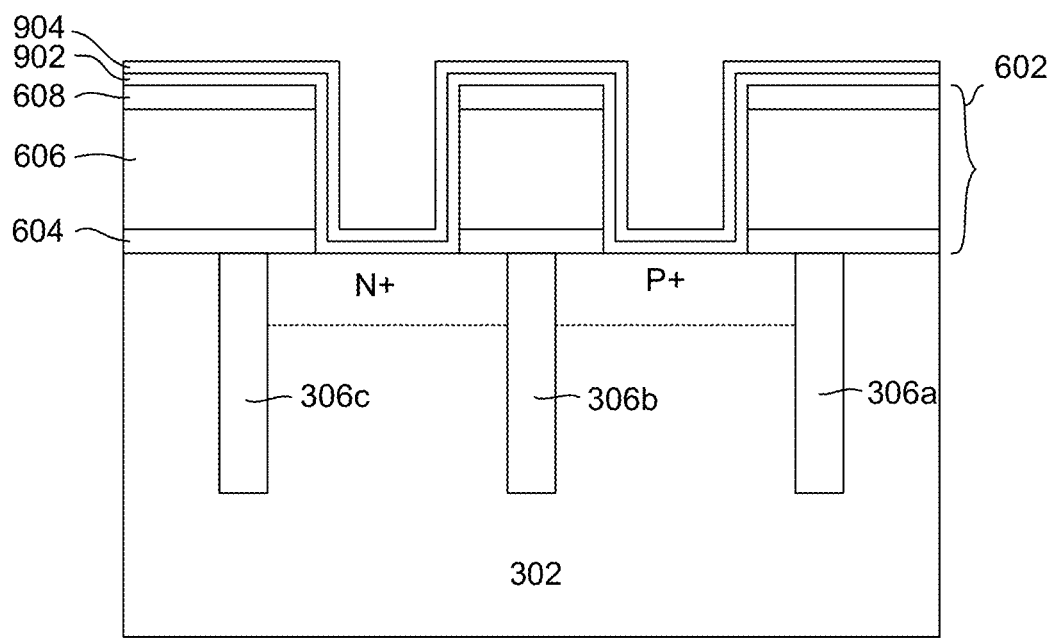

FIG. 9 shows a cross sectional view as seen from line 9-9 of FIG. 8. With reference to FIG. 9, a gate dielectric layer 902 is deposited full film. The gate dielectric layer 902 can be an oxide or nitride such as SiOx or NOx, and can be deposited by sputter deposition, chemical vapor deposition, atomic layer deposition, etc. A protective layer 904 can then be deposited over the gate dielectric layer 902. The protective layer 904, which will be later removed can be useful for protecting the gate dielectric layer during subsequent processing. The protective layer 904 can be formed of a material such as SiN.

Figure 10:
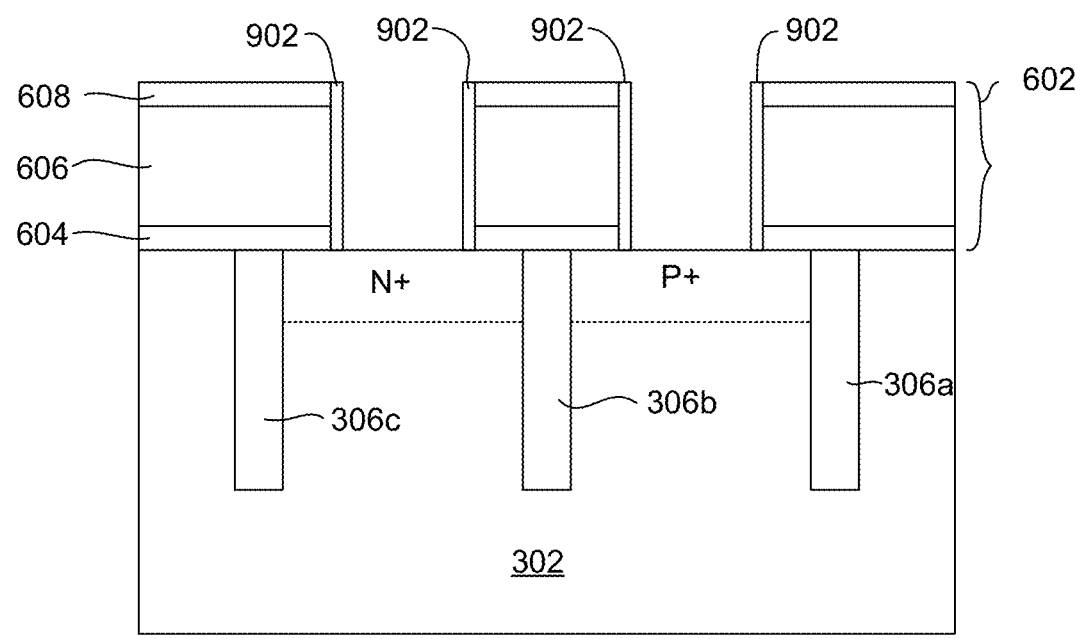

An anisotropic etching process such as ion beam etching (IBE) can be performed to remove horizontally disposed portions of the gate dielectric layer 902 and protective layer, thereby exposing the underlying N+ and P+ doped regions of the substrate 302. The etching process can be a process such as ion milling, and the presence of the protective layer 904 protects the gate dielectric material 902 on the sides of the openings, and allowing the thickness of the gate dielectric 902 to be well controlled. After this anisotropic etching process, a selective etching such as reactive ion etching can be performed to remove any remaining protective layer 904, leaving a structure such as shown in FIG. 10.

Figure 11:
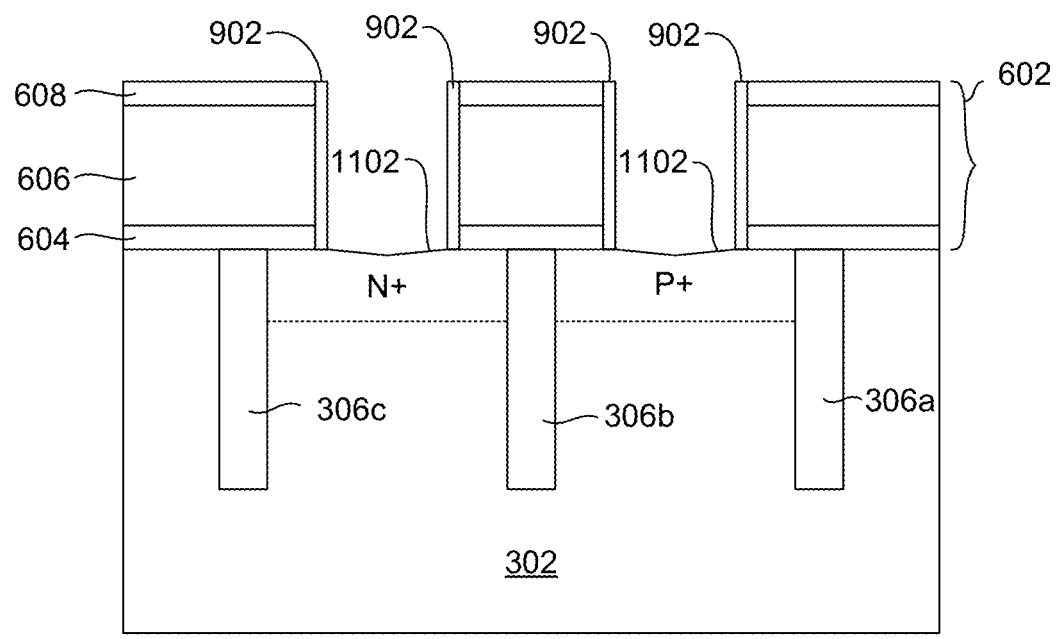

Further etching can then be performed to remove any native oxide from the surface of the substrate 302 in areas exposed through the openings formed in the gate material structure layers 602. This etching can be a reactive ion etching. The etching is preferably performed so as to form a concave, beveled semiconductor surface 1102 at the bottom of the opening as shown in FIG. 11. This surface configuration has been found to provide optimal results for epitaxial growth of semiconductor material.

Figure 12:
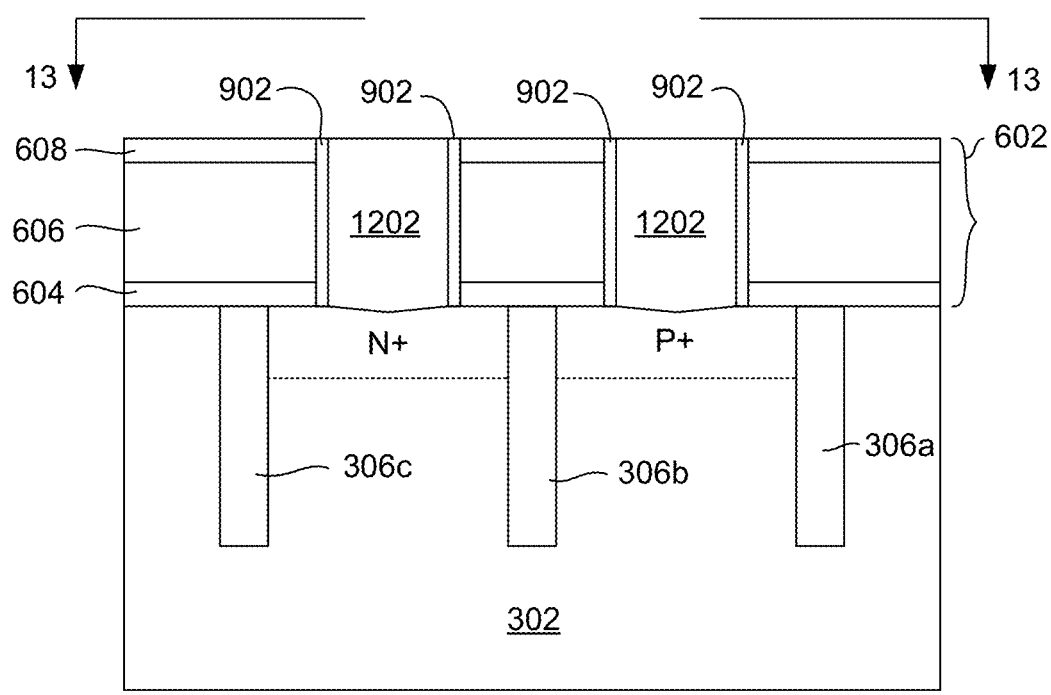

With reference now to FIG. 12, a semiconductor pillar 1202 is grown on the surface of the semiconductor substrate in the openings in the gate line layers 602. The semiconductor pillar 1202 is preferably grown by selective epitaxial growth, which has been found to provide optimal semiconductor properties. The selective epitaxial growth of the semiconductor pillar 1202 causes the semiconductor pillar to have a monocrystalline or nearly monocrystalline structure. For example, the semiconductor pillars 1202 can have a structure that is at least 80 percent monocrystalline by volume or more preferably at least 90 percent monocrystalline by volume. After growing the semiconductor pillars 1202, as chemical mechanical polishing process can be performed to remove any portion of the semiconductor material extending out of the opening, leaving a structure such as shown in FIG. 12.

Figure 13:
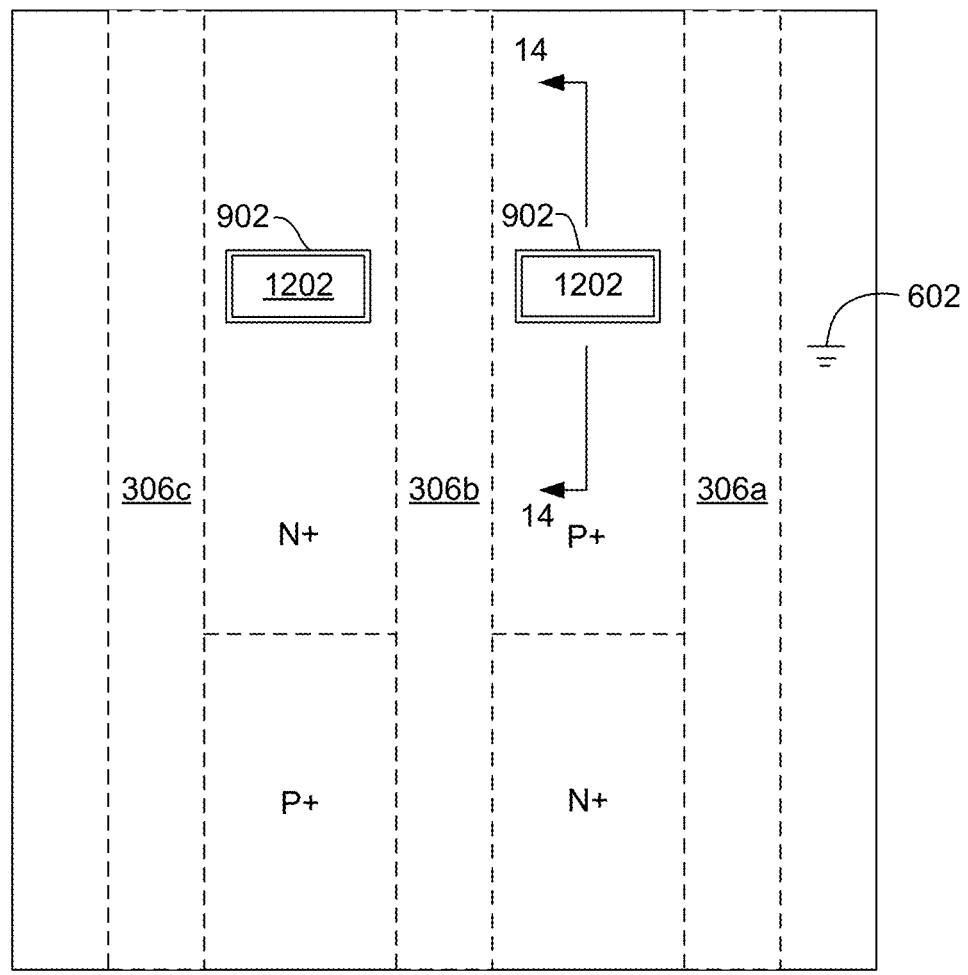

FIG. 13 shows a top-down view as seen from line 13-13 of FIG. 12. In FIG. 13, the location and a possible shape of the semiconductor pillar 1202 and surrounding gate dielectric 902 can be seen. Structures that are hidden beneath the gate line layers 602 are shown in dashed line in FIG. 13.

Figure 14:
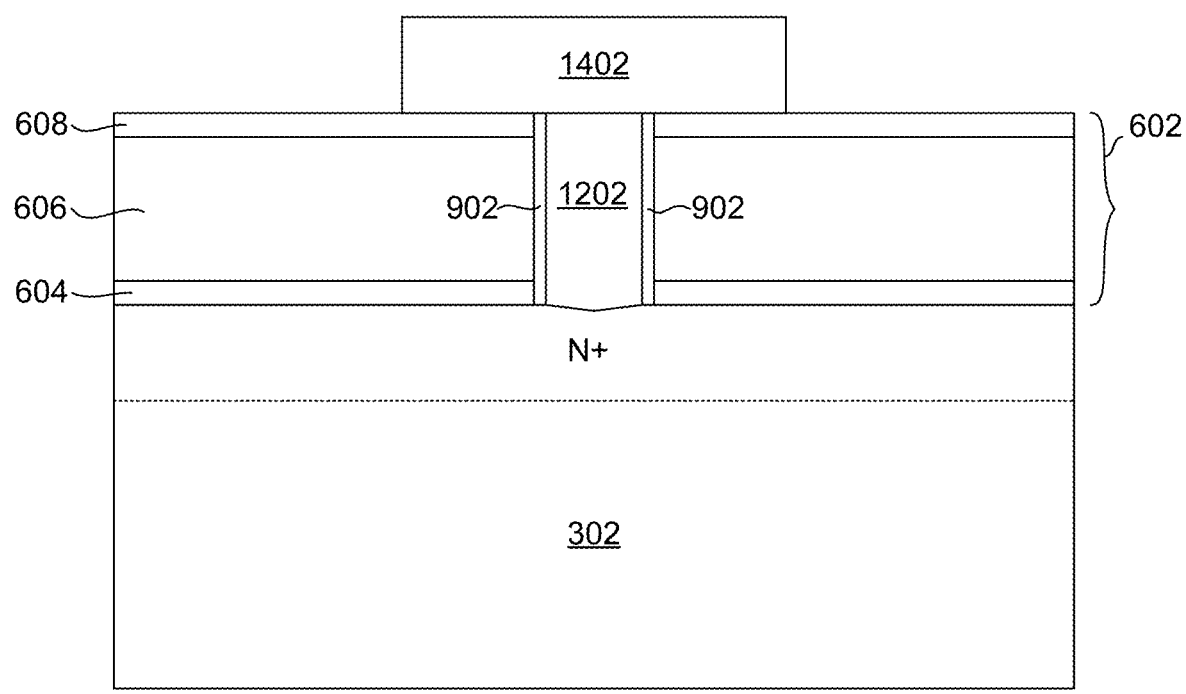
Figure 15:
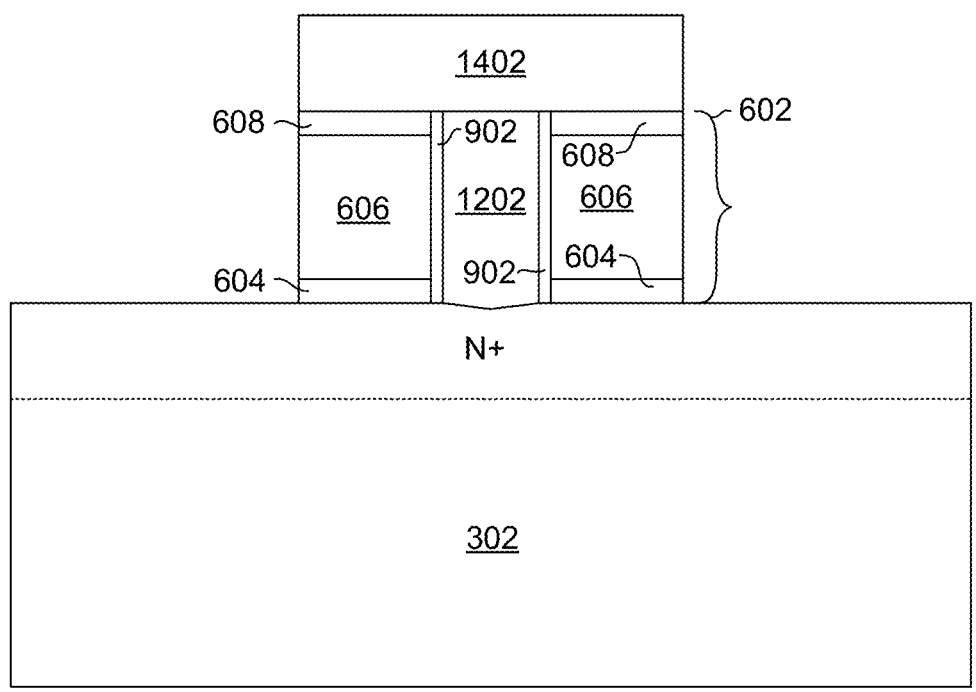
Figure 16:
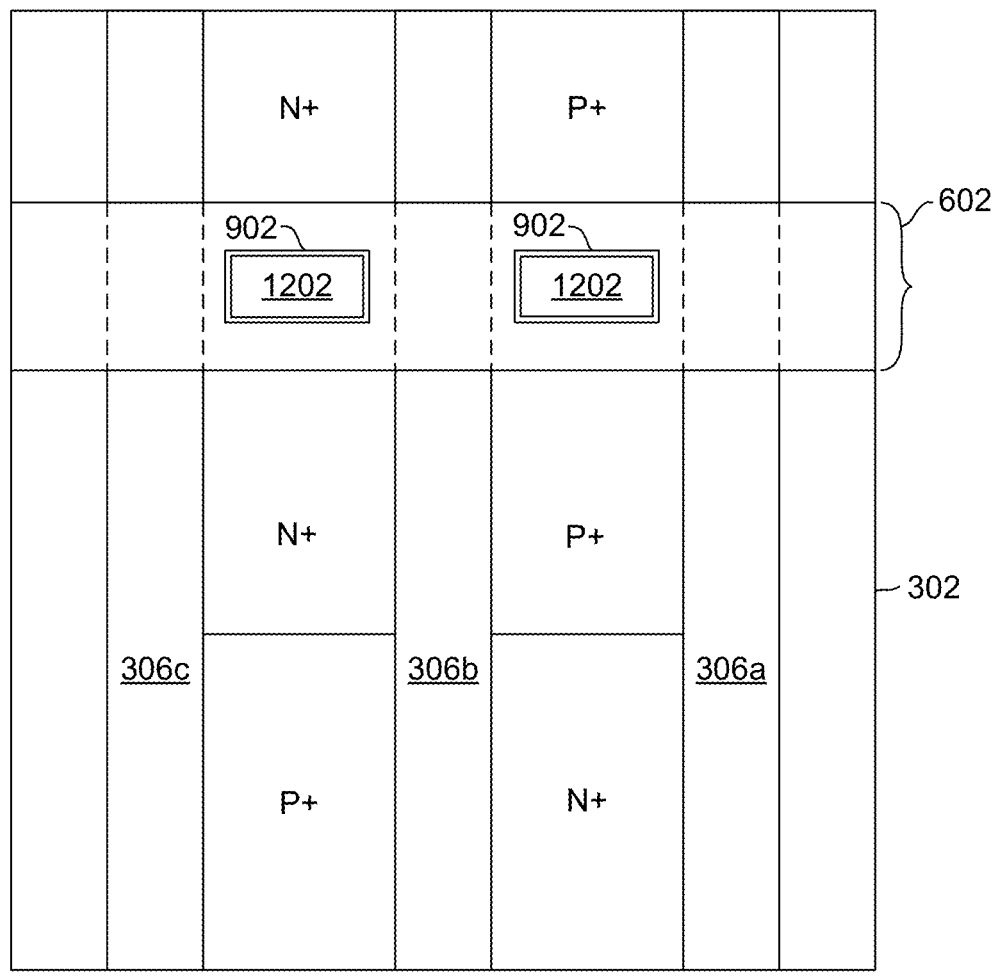

FIG. 14 is a cross-sectional view as seen from line 14-14 of FIG. 13. As seen in FIG. 14, a gate line defining mask structure 1402 is formed over the semiconductor pillar 1202 and gate dielectric 902 and extending laterally there beyond. A material removal process such as ion beam etching or reactive ion etching is then performed to remove portions of the gate structure layers 602 that are not protected by the mask 1402, leaving a structure such as shown in FIG. 15. After the etching or ion beam etching has been completed, the mask 1402 can be removed. The resulting configuration of the gate structure 602 can be more clearly seen with reference to FIG. 16, which shows a top down view. Portions of the trench isolation layers 306 passing beneath the gate line structure 602 are shown in dashed line.

Figure 17:
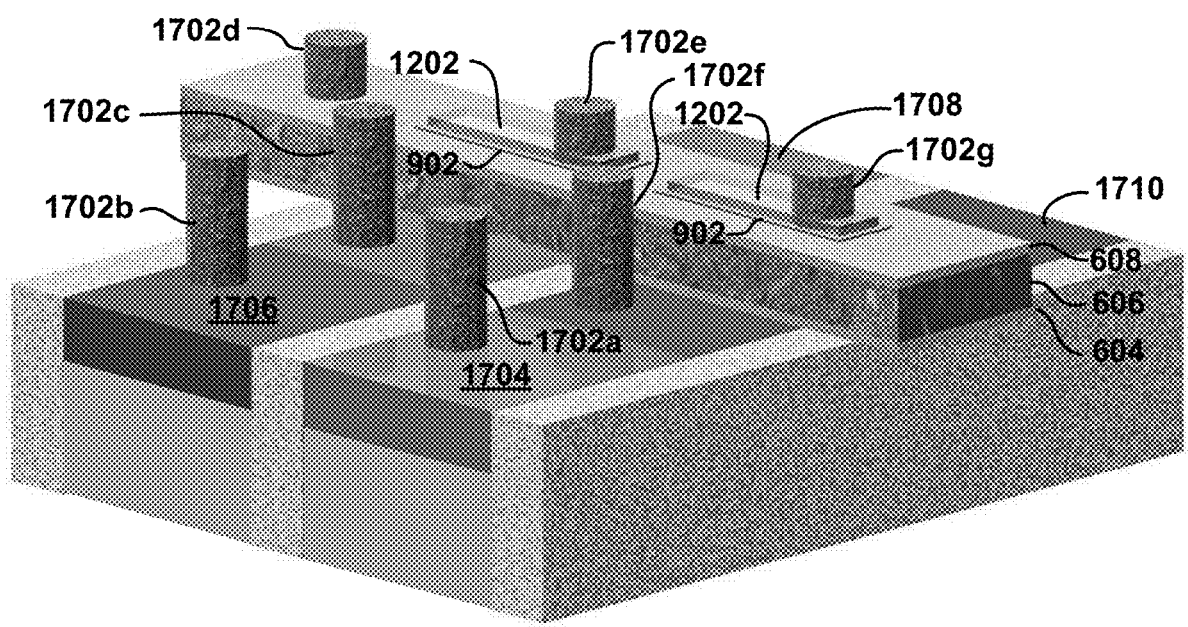

FIG. 17 shows a three-dimensional perspective view of the structure. As shown in FIG. 17, various contact via structures 1702 are formed. Contact structure 1702*a* is connected with the N+ doped portion 1704, and contact structure 1702*b* is connected with P+ doped portion 1706. Contact structure 1702*c* is connected with N+ doped portion 1708, and contact 1702*f* is connected with P+ doped portion 1710. Contact structure 1702*d* extends through the upper dielectric layer 608 to make electrical contact with the electrically conductive gate layer 606. Contact 1702*e* makes electrical contact with the semiconductor pillar structure 1202 of one of the transistor structures, and contact 1702*g* makes electric contact with the semiconductor pillar 1202 of the other transistor structure.

Figure 18:
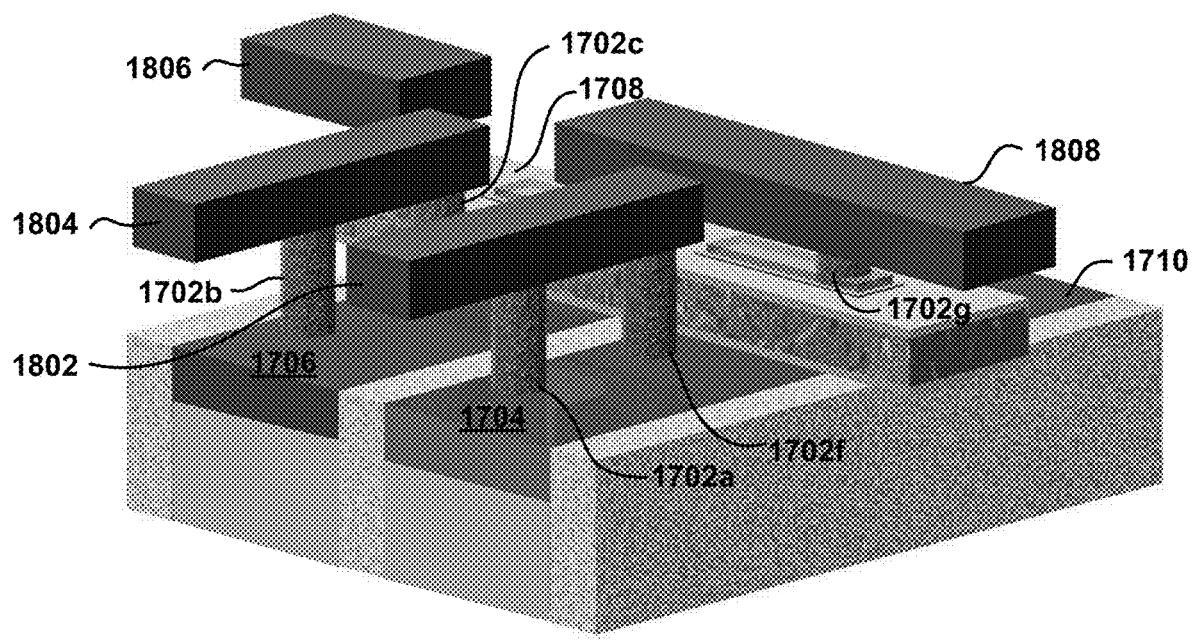

With reference now to FIG. 18, a series of electrical lead structures are formed. Lead structure 1802 connects the electrical contacts 1702*a* and 1702*f*, and in this way electrically connects the N+ doped portion 1704 with the P+ doped portion 1710. Lead structure 1808 can also be connected with Vdd circuitry (not shown). Lead structure 1804 electrically connects contact 1702*b* with contact 1702*c*, and in this way electrically connects P+ doped portion 1706 with N+ doped portion 1708, and can also be connected with Vss circuitry (not shown). Electrical lead 1806 is electrically connected with contact 1702*d* (seen in FIG. 17), and can also be connected with word-line circuitry (not shown). Electrical lead 1808 is electrically connected with contacts 1702*e* (shown in FIG. 17), and 1702*g* and thereby connects both transistor structures together. Electrical lead 1808 can also be connected with Vout circuitry (not shown).

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. An inverter structure comprising:
    a semiconductor substrate;
    first and second regions formed in the semiconductor substrate, the first and second regions being separated by a dielectric isolation structure, the first region having an N+ doped portion and a P+ doped portion on a surface of the semiconductor substrate and the second region having a P+ doped portion and an N+ doped portion on the surface of the semiconductor substrate, wherein the N+ doped portion and the P+ doped portion in each of the first region and second region are adjacent to each other without an overlay between each other, the P+ doped portion of the first region is adjacent to the N+ doped portion of the second region along a direction perpendicular to an alignment of the P+ doped portion and N+ doped portion in the first region, and the N+ doped portion of the first region is adjacent to the P+ doped portion of the second region along a same direction;

a first vertical transistor structure formed on the P+ doped portion of the first region of the semiconductor substrate, and a second vertical transistor structure formed on the N+ doped portion of the second region of the semiconductor substrate;

wherein the first and second vertical transistor structures each comprise a semiconductor pillar structure, at least a portion of which is substantially monocrystalline, and a gate dielectric layer surrounding the semiconductor pillar structure, and further comprising a gate structure at least partially surrounding the gate dielectric layer of each of the first and second vertical transistor structures; and wherein the inverter structure further comprises a first electrically conductive lead connected with the semiconductor pillar structure of each of the first and second transistor structures, a second electrically conductive lead electrically connected with the N+ doped portion and P+ doped portion of the first region of the semiconductor substrate, and a third electrically conductive lead electrically connected with the N+ doped portion and P+ doped portion of the second region.

2. The inverter structure as in claim 1, wherein the gate structure includes a layer of electrically conductive material located between first and second dielectric layers.

3. The inverter structure as in claim 1, wherein the semiconductor pillar structures of each of the vertical transistor structures comprises an epitaxially grown semiconductor material.

4. The inverter structure as in claim 1, wherein the semiconductor pillar structure of each of the vertical transistor structures is at least 80 percent monocrystalline by volume.

5. The inverter structure as in claim 1, wherein the semiconductor pillar structure of each of the vertical transistor structures is at least 90 percent monocrystalline by volume.

6. The inverter structure as in claim 1, wherein each of the semiconductor pillar structures has a rectangular prism shape.

* * * * *